United States Patent
Sullivan

(10) Patent No.: US 8,058,700 B1
(45) Date of Patent: Nov. 15, 2011

(54) SURGE OVERCURRENT PROTECTION FOR SOLID STATE, SMART, HIGHSIDE, HIGH CURRENT, POWER SWITCH

(75) Inventor: James D. Sullivan, Galena, OH (US)

(73) Assignee: InPower LLC, Galena, OH (US)

( * ) Notice: Subject to any disclaimer, the term of this patent is extended or adjusted under 35 U.S.C. 154(b) by 1099 days.

(21) Appl. No.: 11/759,282

(22) Filed: Jun. 7, 2007

(51) Int. Cl.
*H01L 21/02* (2006.01)

(52) U.S. Cl. ............... 257/506; 257/532; 257/E29.001; 257/E29.218; 257/E25.014; 257/E25.024; 257/E27.034

(58) Field of Classification Search ............... 330/207 P, 330/298; 455/115–117
See application file for complete search history.

(56) References Cited

U.S. PATENT DOCUMENTS

| | | | | |
|---|---|---|---|---|
| 3,449,622 | A * | 6/1969 | Wheatley, Jr. | 315/403 |
| 4,322,772 | A * | 3/1982 | Fry | 361/111 |
| 4,351,014 | A * | 9/1982 | Schofield, Jr. | 361/100 |
| 5,455,491 | A * | 10/1995 | Hajagos et al. | 315/291 |
| 6,911,848 | B2 * | 6/2005 | Vinciarelli | 327/108 |
| 7,265,525 | B2 * | 9/2007 | Xu et al. | 323/271 |
| 7,408,755 | B1 * | 8/2008 | Ye et al. | 361/93.1 |
| 7,768,214 | B2 * | 8/2010 | Doi et al. | 315/291 |
| 7,772,786 | B2 * | 8/2010 | Hosoda et al. | 315/291 |
| 7,788,608 | B2 * | 8/2010 | Huynh et al. | 716/127 |
| 2002/0008499 | A1 * | 1/2002 | Henry | 323/267 |
| 2002/0071670 | A1 * | 6/2002 | Odaka et al. | 396/206 |
| 2003/0007372 | A1 * | 1/2003 | Porter et al. | 363/37 |
| 2003/0057929 | A1 * | 3/2003 | Suzuki et al. | 323/282 |
| 2003/0227280 | A1 * | 12/2003 | Vinciarelli | 323/265 |
| 2004/0056642 | A1 * | 3/2004 | Nebrigic et al. | 323/284 |
| 2004/0095103 | A1 * | 5/2004 | Kernahan | 323/272 |
| 2004/0189229 | A1 * | 9/2004 | Nadd et al. | 318/434 |
| 2005/0088161 | A1 * | 4/2005 | Balakrishnan et al. | 323/284 |
| 2005/0286271 | A1 * | 12/2005 | Vinciarelli | 363/17 |
| 2006/0001406 | A1 * | 1/2006 | Matan | 320/166 |
| 2006/0033453 | A1 * | 2/2006 | Cao et al. | 315/291 |
| 2006/0275970 | A1 * | 12/2006 | Nadd et al. | 438/197 |
| 2007/0035285 | A1 * | 2/2007 | Balakrishnan et al. | 323/284 |
| 2007/0080905 | A1 * | 4/2007 | Takahara | 345/76 |
| 2008/0013351 | A1 * | 1/2008 | Alexander | 363/123 |
| 2008/0048784 | A1 * | 2/2008 | Shih | 330/298 |
| 2008/0094044 | A1 * | 4/2008 | Ji | 323/268 |
| 2008/0218271 | A1 * | 9/2008 | Mitzlaff et al. | 330/298 |
| 2009/0201231 | A1 * | 8/2009 | Takahara et al. | 345/76 |
| 2011/0002080 | A1 * | 1/2011 | Ranta | 361/277 |
| 2011/0018618 | A1 * | 1/2011 | Shiu et al. | 327/536 |

OTHER PUBLICATIONS

Basic Electronics Tutorials by Wayne Storr copyright 1999-2011.*
Infineon Technologies, Smart Highside High Current Power Switch, Oct. 1, 2003, pp. 1-16, Infineon Technologies AG, Munchen, Germany.

* cited by examiner

*Primary Examiner* — Eugene Lee
*Assistant Examiner* — Mohammed Shamsuzzaman
(74) *Attorney, Agent, or Firm* — Frank H. Foster; Kremblas & Foster

(57) ABSTRACT

An improvement for a smart, highside, high current, power switch module formed in an integrated circuit having at least one composite MOS/FET transistor switch connected to controlling and protection circuits. The power switch module has a load terminal (L), a battery input terminal (B), a control input terminal (C) and a diagnostic feedback terminal (M). The improvement provides overcurrent protection from a substantially instantaneous short circuit across an electrical load connected to the load terminal of the power switch module. The improvement is a capacitive circuit element connected between the battery input terminal (B) and the diagnostic feedback terminal (M). The capacitance of the capacitive circuit element should be at least large enough that the capacitive circuit element applies a power supply voltage to the controlling and protection circuits for a time interval that maintains the protection circuits operative and able to turn OFF the MOS/FET transistor switch in the event of the short circuit.

8 Claims, 2 Drawing Sheets

SURGE OVERCURRENT PROTECTION FOR SOLID STATE, SMART, HIGHSIDE, HIGH CURRENT, POWER SWITCH

BACKGROUND OF THE INVENTION

1. Field of the Invention

This invention relates generally to electronic circuits for the controlled switching of high current loads and more particularly relates to protecting solid state, smart, highside, high current, power switches from damage caused by excessively high currents that begin essentially instantaneously, such as from a short across the load terminals, and destroy the smart power switches, despite their associated protection circuits.

2. Description of the Related Art

Convenient energy efficient operation of electrical equipment, appliances and other electrical devices often requires a switch for turning the device on and off. This is particularly important when multiple different devices are powered by a vehicle battery in order to minimize drain on the battery by permitting selected operation of only those devices that are currently being used. Some electrical devices are high power devices that draw large currents. For those, it is often desirable to control the switch that switches the high current from a low power electrical signal. For this purpose, relays or power contactors were traditionally used. However, such devices have mechanical electrical contacts which are subject to corrosion and the possibility of having the contacts welded together and suffer from numerous other failure modes.

When solid state technology appeared, it was first applied to develop solid state switches that could be used for switching low currents associated with low power applications but the available solid state switching devices could not tolerate higher currents. However, MOS/FET devices have more recently been developed that can switch currents on the order of a hundred amperes or more. These switching devices have thousands of MOS/FETs formed in an integrated circuit and connected in parallel so they each carry a small portion of the current and operate together as a high current, composite MOS/FET. Additionally, modern integrated circuit technology also permits a variety of other circuits to be formed in the same integrated circuit to provide for operating, controlling and protecting the MOS/FETs. Because these associated circuits include logic and sensing circuits and can detect a variety of fault conditions and turn off the MOS/FETs in order to protect the integrated circuit module, the modules are called "smart". Consequently, the combination of the current switching MOS/FETs and their associated circuits provide high power switch modules that manufacturers can use to construct high power switches for applications in their field. In addition to the relatively high currents that each integrated circuit module can switch, manufacturers of high power switches can connect multiples of these integrated circuit modules in parallel to increase the maximum current their products can switch by a multiplier equal to the number of parallel modules.

A particularly useful type of power switching module is a smart, high side, high current power switch. High side means that their power switching terminals are connected between the high side of the power source, such as the positive terminal of a battery, and the load being switched. The load is connected between the switch module and a common power ground. There are a few manufacturers who supply such modules and FIG. 1 illustrates an example module 10, which is a PROFET® BTS555 offered by Infineon Technologies. This first generation high current power switch module was designed to control a starting motor on a vehicle.

Referring to FIG. 1, The power switch module 10 is an integrated circuit that has a composite MOS/FET 12 and several associated circuits for operating, controlling and protecting the MOS/FET. Typically, such modules have four terminals to which other, external circuit elements are connected. One terminal is a load terminal L that is connected to one terminal of the load being controlled by the smart switch. The other terminal of the load itself is connected to the power circuit ground. The power source, such as a 12 or 24 volt vehicle battery, is connected to a battery terminal B and the other power source terminal is connected to the power circuit ground. Control of the switching module for turning it ON and OFF is accomplished by grounding a third, control input terminal C to turn it ON and disconnecting that ground connection to turn it OFF.

The fourth terminal M is a sensing or diagnostic terminal that is an output of a current mirror circuit. The current mirror circuit utilizes a few of the large number of individual MOS/FETs formed in the integrated circuit of the switch module. A current mirror circuit is well known in the art and, as applied to the switch module, the drains of all the individual MOS/FETs are connected together and most of the sources of the individual MOS/FETs are connected to the main output load terminal L for switching the high load current. A few of the sources, however, are instead used for the current mirror circuit and connected to the sensing terminal M. As known in the art, a current minor circuit provides a current through the terminal M that is proportional to the load current through the majority of MOS/FETs that conduct the load current through the module 10. Preferably, the terminal M is connected to the power circuit ground through a resistor $R_{IS}$ having a resistance, for example, of 1000 ohms. However, the current will have the current proportionality property as described above if a conductor is substituted for the resistor $R_{IS}$.

Among the protection circuits that manufacturers have integrated into the power switch modules is a circuit that senses module temperature and shorts the MOS/FET gate to ground and thereby open the MOS/FETs to a non-conductive, high resistance state in the event a temperature above a selected maximum operating temperature is sensed. Consequently, if a power switch module gets too hot, it is shut down by its own associated, internal circuitry before the module is damaged. Another protection circuit that is commonly included among the associated protection circuits is a circuit that senses load current and opens the MOS/FETs to a non-conductive, high resistance state in the event a selected maximum operating current is sensed. Yet another associated protection circuit typically integrated in the smart power switch module is a circuit that modulates the conduction of the power switch module. For example, if a reverse voltage is applied to the power switch module, such as from an inductive load immediately after it has been shut off, the power switch module modulates the current so that the dissipation of heat energy from the power switch module can be extended and distributed over a longer time interval. Still another protection circuit ordinarily provided among the control and protection circuits of the power switch module is an undervoltage protection circuit. This circuit senses the output voltage and, if the battery slowly discharges to a level that the control and protection circuits have an insufficient supply voltage to power them, the undervoltage circuit will operate and turn OFF the power switch. The variety of protection circuits in the power switch module include both digital logic and analog circuits.

In addition to protection circuits, there are also control circuits associated with the MOS/FETs in the integrated circuit. It is necessary to develop a charge that is positive to negative between the gate and the source to turn on the MOS/FETs. To do this, since the device is floating, a charge pump circuit is used. The charge pump circuit is well known in the art and gets its power from a drain connection. The MOS/FETs are controlled by supplying a controllable ground connection through module terminal C. When terminal C is not grounded, the internal electronics cause the gate to be shorted to the source turning the MOS/FETs OFF. When terminal C is grounded, the charge pump is turned ON and supplies a high enough voltage between the source and the gate to turn ON the MOS/FETs to their conducting state.

However, unfortunately I have discovered that, despite all the protection and control circuits on board such power switching modules, the switching module are still subject to destruction by a high surge current, such as is caused by a sudden, very low resistance, short across the load terminals. An essentially instantaneous short, such as can be caused by a mechanic inadvertently inserting a metallic tool between the load terminals, causes the destruction of such power switches. I have experimentally replicated the destruction of the power switch modules in a laboratory by such an instantaneous short circuit.

It is therefore an object and feature of the present invention to provide a manner of protecting such integrated power switch modules by means of a circuit that is, of necessity, restricted to connection to two or more of the only four terminals that are externally accessible on the power switch modules. This permits manufacturers, who utilize existing smart, highside, high current, power switch module designs in their products, to protect the power switch modules from destruction by such instantaneous very low resistance short circuits.

BRIEF SUMMARY OF THE INVENTION

The invention is an improvement for a smart, highside, high current, power switch module formed on an integrated circuit having at least one composite MOS/FET transistor switch that is connected to controlling and protection circuits. The power switch has a load terminal, a battery input terminal, a control input terminal and a diagnostic feedback terminal. The improvement is a capacitive circuit element connected between the battery input terminal and the diagnostic feedback terminal of the power switch module. This improvement provides overcurrent protection from a substantially instantaneous short circuit across an electrical load connected to the power switch module so that such a short circuit does not destroy the power switch module.

Figure 1:
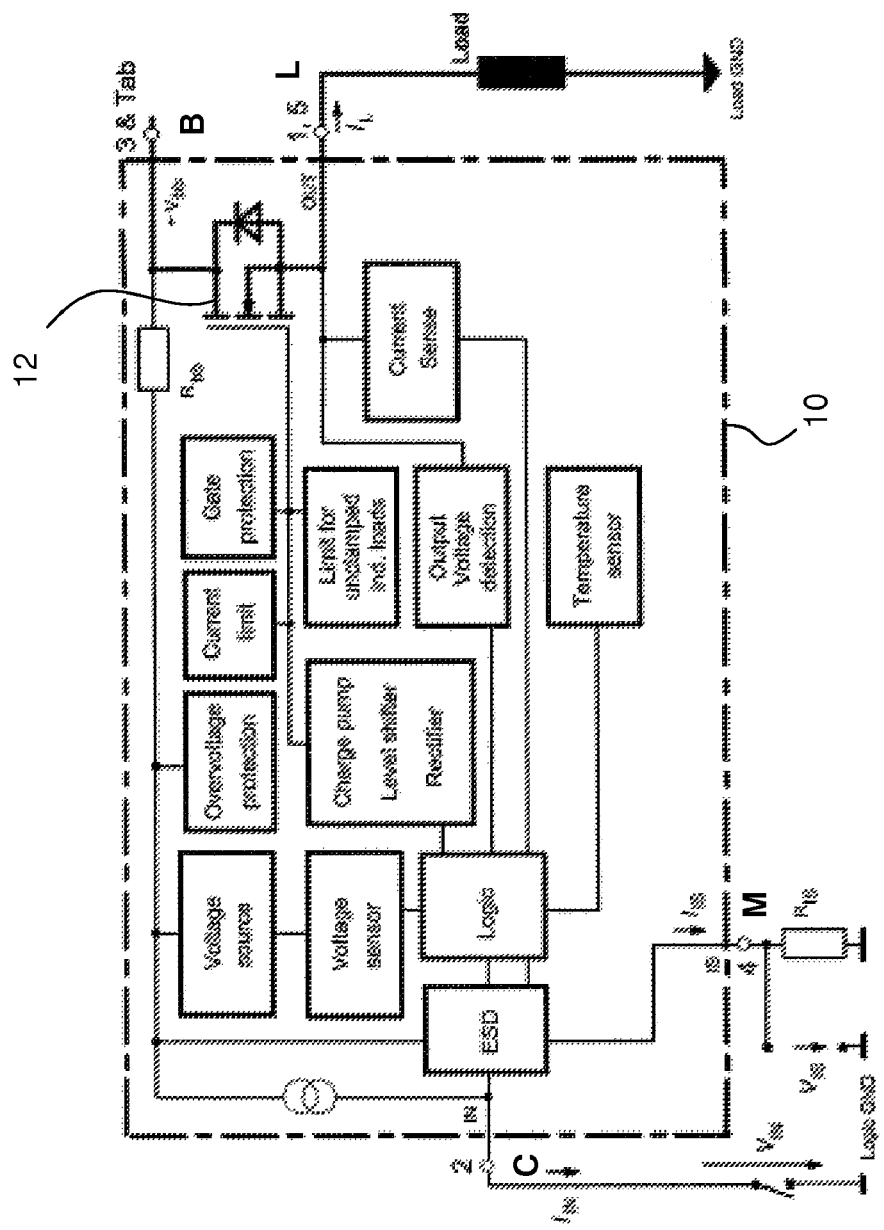
FIG. 1 is a schematic diagram of a smart, highside, high current, power switch module formed in an integrated circuit and commercially available in the prior art.

In describing the preferred embodiment of the invention which is illustrated in the drawings, specific terminology will be resorted to for the sake of clarity. However, it is not intended that the invention be limited to the specific term so selected and it is to be understood that each specific term includes all technical equivalents which operate in a similar manner to accomplish a similar purpose.

DETAILED DESCRIPTION OF THE INVENTION

Figure 2:
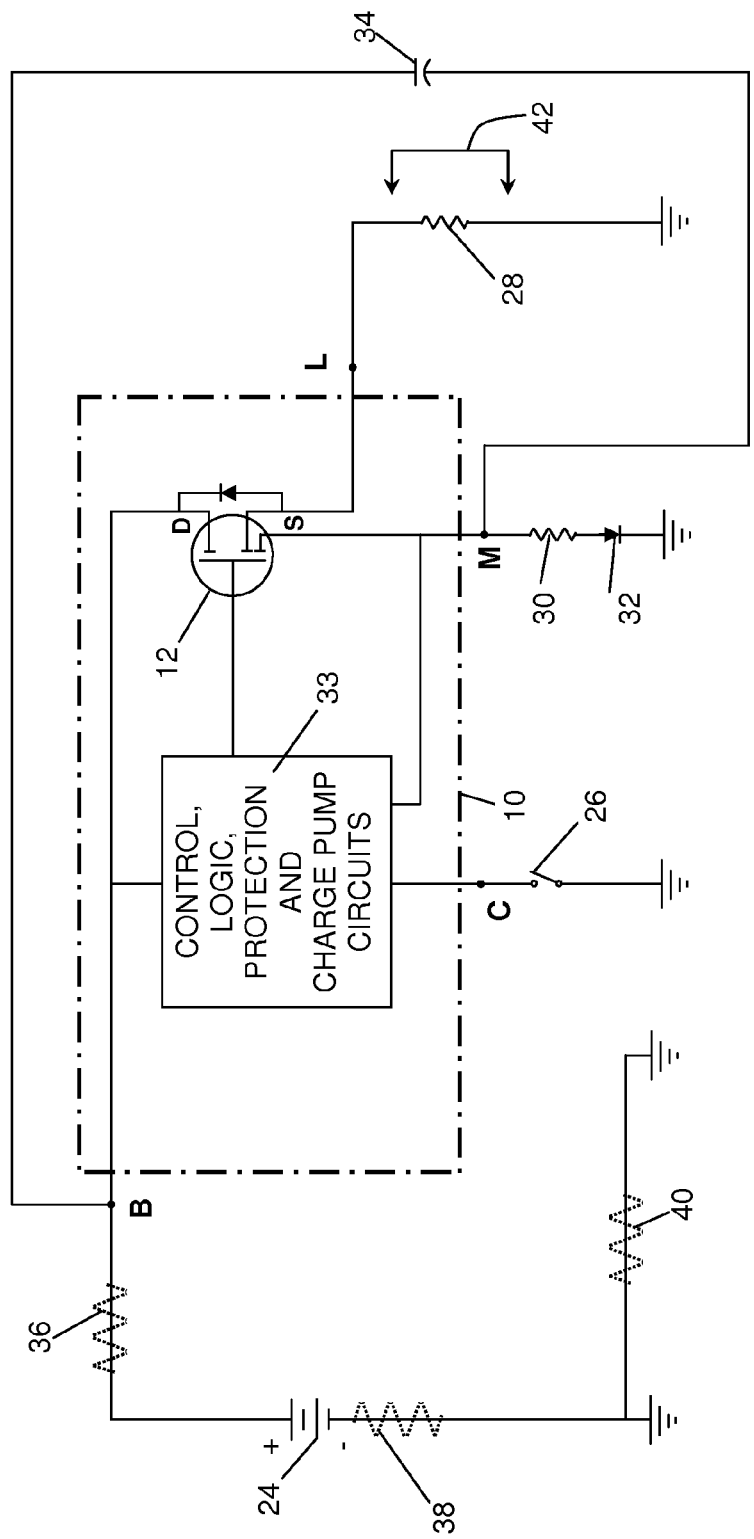
FIG. 2 is a schematic diagram of a smart, highside, high current, power switch module of the type illustrated in FIG. 1 but having the improvement of the invention combined with it.

FIG. 2 illustrates a power switching module 10 with a composite MOS/FET 12 like that illustrated in FIG. 1. It also has the same accessible four terminals B, C, L and M. The battery terminal B is connected to the positive side of a battery 24 with the negative side of the battery 24 connected to the power circuit ground. The control terminal C is connected through a control switch 26 to the power circuit ground. The load terminal L is connected to the load 28 which typically may have a resistance of 1 ohm or less and the opposite side of the load is connected to the power circuit ground. The diagnostic feedback, current minor terminal M is preferably connected to ground thorough a series resistor 30 and a diode 32. A typical resistance of resistor 30 is 1000 ohms although no resistor or a resistor of a different value may be used. For simplicity of illustration, the control and protection circuits 33 of the prior art power switch module are lumped together. Interconnection to them in an existing integrated circuit is impossible, except for connection to the four accessible terminals B, C, L and M.

The improvement which protects the power switch module from an instantaneous, high, surge overcurrent is a capacitive circuit element, such as a capacitor 34, that is connected between the battery terminal B and the diagnostic, current minor terminal M. A value of capacitance that has proven effective in protecting the power switch module is a capacitor having a value of 1 microfarad. A ceramic capacitor is preferred. The operation of the invention and the manner it protects the power switch module may be understood by initially describing my analysis of the problem created by the very low resistance short circuit across the load 28 and why the power switch module is destroyed by the current surge even though the power switch module has integrated protection circuits intended to protect it from a variety of fault conditions. This analysis leads to the reason for the failure of the smart power switch module to protect itself in this fault condition despite its capability to protect itself from many other fault conditions. From there the operation of the improvement and criteria for selecting the capacitive circuit element are described.

The problems caused by a fault condition created by a dead short across the load can be revealed by looking at the resistance around the power circuit loop that consists of the battery, the power switch module, the load and the conductive paths connecting them together.

Modern power switch modules have specification characteristics that permit steady state currents on the order of 150 amps or more and permit surge currents for a short duration on the order of 500 amps. The protection circuits provided integrally with these modules and described above are designed to detect excessive currents and turn off the MOS/FETs of the module. When a manufacturer uses these modules in a circuit with multiple modules connected in parallel, these current limits for the parallel combination is multiplied. For example, two such parallel modules can carry an incredible 300 or more amps steady state and surge currents of 1000 amps for a limited duration. Four parallel high power switch modules increases these limits to 600 amps and 2000 amps respectively. The modules are designed to approach and nearly as possible a perfect switch. They have the lowest possible ON resistance which minimizes the heat generated in the modules. For example, the BTS555 module that was described above has an ON resistance specification of 2.5 milliohms which is 0.0025 ohms. This ON resistance, RDS, is essentially the drain-source resistance of the composite MOS/FET formed in the integrated circuit of the module. Consequently, two modules in parallel exhibit an ON resistance of 0.00125 milliohms and four in parallel exhibit half of that. Furthermore, if the modules are colder than these maximum currents, their ON resistances are even smaller.

Under normal circuit operating conditions, the resistance of the load 28 provides the principal limit on the current conducted through the high power circuit, including through the MOS/FETs 12 of the power switch module 10. However, if the load terminal L is suddenly short circuited to the power circuit ground, that resistance becomes essentially or near zero ohms. Under that short circuit condition, the only limit on the current through the power switch module is the sum of the resistance around the power circuit loop.

Ordinarily, the electrical conductors and their interconnections are considered as ideal, zero resistance connections because their resistance, under normal operation and most fault conditions, is so small that it can be ignored. It is common practice among those skilled in the art to think of the conductor paths as perfect conductors because their resistance is so much less than other resistances that resistance of the conductors and connectors can be ignored. However, everything has some resistance and it appears to play a major role in how these circuits perform under the fault condition that is the subject of this invention. The power circuit conductors and their connections have a finite, though small, resistance which is illustrated by the lumped resistance 36 in FIG. 2. Additionally, the battery 24 has an internal resistance illustrated as resistance 38. Furthermore, there is ordinarily a ground return path, for example through the body of a vehicle, which also a resistance illustrated by the resistance 40.

As a result, although the load resistance limits the current in normal operation, when the load resistance 28 is shorted by a low resistance conductor 42, the only limit on the current is the sum of the battery resistance, the circuit conductor path resistance, the ground return resistance and the MOS/FET resistance. If a dead short is placed across the load terminals, the current would instantaneously rise to the battery voltage divided by the sum of these resistances remaining in the circuit.

For example, if MOS/FETs 12 of the power switch module 10 have a composite resistance of 0.0025 ohms and the sum of the external circuit resistances 36, 38 and 40 is 0.0025 ohms, the instantaneous current could approach 2400 amps. Depending upon the resistances of the external power circuit, the instantaneous current can be on the order of several hundred or several thousand amps. The critically important result is that a short across the load terminal instantaneously causes the voltage across the MOS/FETs 12 of the power switch module 10 to drop to 6 volts and the voltage across the external circuit resistances 36, 38 and 40 to increase to 6 volts. If the external circuit resistance were 0.005 ohms, the result would be that the voltage across the MOS/FETs 12 of the power switch module 10 would drop to 4 volts and the voltage across the external resistances would increase to 8 volts. If multiple power switch modules are connected in parallel, their parallel resistance is even less, the voltage drop across the external circuit resistances is even more and therefore the voltage dropped across the power switch module 10 becomes even less.

I have concluded that the reason the power switch modules do not turn themselves OFF as a result of these huge overcurrents, despite their on board protection circuits that are designed to turn them off when overcurrents are encountered, is that their protection circuits instantaneously become inoperable because the voltage across the power switch modules is instantaneously reduced to such a low level that the protection circuits do not have enough voltage and power to operate. They instantaneously become inoperable. There is a charge between the gate and the source when the MOS/FET is conducting and that charge requires some minimum time to dissipate and allow the MOS/FETs to turn OFF. However, in the event of a short across the load terminals, the control and protection circuits of the smart switch module become inoperative before they can turn off the MOS/FETs.

The problem is that the control and protection circuits require a minimum voltage to operate and below that voltage they become inoperative. Below that minimum voltage, they lose their ability to control the MOS/FETs. The voltage that provides the "power supply" to these control and protection circuits is the voltage between the drain input at the battery terminal B and the ground control device or switch connected to the control terminal C. Although the manufacturers of the power switch modules recognized that the control and protection circuits will fail if that "power supply" voltage reaches a minimum voltage and they have provided undervoltage protection circuitry to turn OFF the MOS/FETs to protect the power switch module if that happens, that protection circuit fails to operate and turn OFF the MOS/FET in the case of the instantaneous short across the load. The reason it fails is that the undervoltage protection circuits, that are provided by the prior art, themselves instantaneously become inoperative before they can respond and turn the power switch module OFF as a result of the short circuit across the load. They are operable only in the event of a relatively slow, transient reduction in voltage, such a caused by battery discharge.

The MOS/FET resistance and the external circuit resistance form a voltage divider. As the ratio of MOS/FET ON resistance to external circuit resistance becomes less, the voltage across the power switch module becomes less and the problem of insufficient voltage to operate the protection circuits becomes worse because that "power supply" voltage becomes less. Consequently, the problem is worsened both by parallel power switches, which reduce the MOS/FET ON resistance, and by any increased external circuit resistance. For example, a loose bolt on an external circuit connecter that connects two circuit elements or corrosion in a connection, make the problem even worse. That is what is believed to lead to the destruction of the power switch modules despite their protection circuits. Even though the presence of a greater external circuit resistance means the current limits are less likely to be exceeded or are exceeded by a lesser excess current, that greater external circuit resistance causes greater reduction in the voltage available across the power switch module to power its protection circuits.

The problem then is to find a way to maintain the operability of the protection circuits long enough following a short across the load terminals. The power switch module is an integrated circuit and only its four terminals are available. The problem is, with only the four terminals available, how can a source of power be provided that can maintain the control and protection circuits in the dead short fault condition for a time interval long enough to permit the on board protection circuits to detect the fault and turn the MOS/FETs OFF.

The control input terminal C is essentially a high input impedance gate. It just receive a signal. It has nothing to do with powering the device and as a high impedance input, it can not be used to supply power to the control and protection circuits. So the control terminal C cannot be used. The load terminal L also cannot be used to supply power because it is effected by the short, fault condition. It is grounded by the fault condition of a dead short across the load.

The solution is to put an appropriately sized capacitive circuit element, such as a capacitor, between the battery terminal B and the current minor input terminal M in the external circuit. The battery terminal B is the common battery supply voltage terminal and is the high side of the "power supply" terminals of the internal control and protection circuits. The power MOS/FET device, when in a current minor configuration, must have a current minor connection to a terminal M. The terminal M provides access to the substrate of the control and protection circuits. It is virtually connected to the internal integrated circuit ground for the control and protection circuits of this type of power switch module. It is the ground of the internal circuit "power supply" terminal. Importantly, the diagnostic feedback terminal M is accessible. Therefore, the capacitor becomes a temporary, floating power supply that is not effected by the dead short and the resulting current and voltage changes. The bigger the capacitance, the longer it will maintain the operability of the control and protection circuits.

The capacitance of the capacitive circuit element is determined by the time required for the protection circuits of the power switch module to shut itself down; that is to switch the state of the MOS/FETs to a their non-conducting, high resistance state. I found the appropriate value experimentally by trying different size capacitors, starting small and blowing up the devices, until I found a capacitance value large enough that the power supply module shut itself down. I tried a capacitor having a capacitance of 0.1 microfarads and the power switch module was destroyed. I found that a capacitor of about 1 microfarad, however, permitted the power switch module to turn itself off.

The typical power switch module has an undervoltage, an overcurrent and an overtemperature protection circuit any of which will shut it down. However, the overtemperature protection circuit requires a longer time interval than the overcurrent protection circuit because it takes longer for the integrated circuit to heat up than it does to detect the overcurrent. Preferably the capacitor is large enough to supply power long enough for at least both the overcurrent and the overtemperature protection circuits to be able to operate, so the longer time interval is desired. However, since one overcurrent protection circuit senses and shuts the module down as a result of the current exceeding the maximum surge current, and it is possible that the maximum surge current will not be exceeded if the external circuit resistance is large enough, it is desirable that time interval, during which the protection circuits are maintained operable, be sufficient for the overtemperature protection circuit to shut down the module. I estimate that a capacitor having a capacitance of 1 microfarad holds the protection circuits operable for 500 microseconds to a millisecond.

In addition to the above factors that need to be considered in the selection of the capacitance of the capacitive circuit element, there are some others. As the capacitance is made larger, the response time of the current mirror circuit that provides a current proportional to the load current is increased. As a result, the responsiveness of the current minor signal at the diagnostic feedback terminal M is reduced and it does not as accurately represent the value of the load current. Additionally, the larger the capacitance, the more any power supply ripple is coupled into the circuit and the more it costs. Another factor is that an actual short circuit across the load is not necessarily a simple step function. More realistically, the short circuit may progress in time in a dynamic, intermittent and/or variable manner causing transients and/or spikes as a result of the shorting conductor bouncing at a contact point or having the resistance of its contacting surfaces vary in time as a function of a variable contact force. Consequently, the capacitance should be large enough not only to maintain the protection circuits operable for a sufficient time interval to shut down the power switch module in response to a step function, but also large enough to maintain the protection circuits for a longer time interval that is sufficient to allow such shut down in response to such a progressing, dynamic, intermittent and/or variable short circuit. Therefore, although a smaller capacitance would be likely to prevent damage to the power switch module in response to some and possibly many short circuit conditions, and a larger capacitance would be likely to prevent damage in response to all short circuit conditions, based upon my experimental results and my technical opinion, a capacitance in the range from 1 microfarad to 10 microfarads is the best compromise among all these factors to provide the optimum operation.

In addition, the capacitor should have a very low series resistance and the least possible inductance. The reason for minimizing the inductance in the capacitor is to minimize inductance in the capacitor discharge circuit in order to avoid oscillation. Therefore, I prefer to use a ceramic capacitor.

Additionally, it is desirable to insert a blocking diode 32 in the external sensing circuit connected to the diagnostic feedback terminal. The diode 32 is connected in series in a circuit branch connected between the diagnostic feedback, current minor terminal M and a power circuit ground. The diode 32 serves to block capacitor discharge through the external circuit. The diode 32 is not necessary but it allows the capacitor to maintain the control and protection circuits operable for a longer time interval. It prevents discharge current from the capacitive element from flowing through circuitry external to the power switch module.

This detailed description in connection with the drawings is intended principally as a description of the presently preferred embodiments of the invention, and is not intended to represent the only form in which the present invention may be constructed or utilized. The description sets forth the designs, functions, means, and methods of implementing the invention in connection with the illustrated embodiments. It is to be understood, however, that the same or equivalent functions and features may be accomplished by different embodiments that are also intended to be encompassed within the spirit and scope of the invention and that various modifications may be adopted without departing from the invention or scope of the following claims.

The invention claimed is:

1. An improvement for a smart, highside, high current, power switch module formed in an integrated circuit having at least one composite MOS/FET transistor switch connected to controlling and protection circuits, the power switch module having a load terminal (L), a battery input terminal (B), a control input terminal (C) and a diagnostic feedback terminal (M) which is not connected to the load terminal, the improvement providing protection from load fluctuations, including overcurrent, across an electrical load connected to the load terminal of the power switch module and comprising:
   a capacitive circuit element connected between the battery input terminal (B) and the diagnostic feedback terminal (M).

2. An improvement in accordance with claim 1 wherein the capacitance of the capacitive circuit element is at least large enough that the capacitive circuit element applies a power supply voltage to the controlling and protection circuits for a time interval that maintains the protection circuits operative and able to turn OFF the MOS/FET transistor switch in the event of said short circuit.

3. An improvement in accordance with claim 2 wherein the capacitance is substantially 1 microfarad.

4. An improvement in accordance with claim 2 wherein the capacitance is at least large enough to maintain the protection circuits operative for at least substantially 500 microseconds.

5. An improvement in accordance with claim 2 wherein a diode is connected in series in a circuit branch connected between the diagnostic feedback terminal (M) and a power circuit ground for preventing discharge current from the capacitive element from flowing through circuitry external to the power switch module.

6. An improvement in accordance with claim 2 wherein the capacitance has a value that maintains the protection circuits operative for at least a time interval in the range from substantially 500 microseconds to 1 millisecond.

7. An improvement in accordance with claim 2 wherein the capacitance is within a range from substantially 1 microfarad and substantially 10 microfarads.

8. An improvement in accordance with claim 2 wherein the capacitive circuit element is a ceramic capacitor.

\* \* \* \* \*